(12) United States Patent
Xia et al.

(10) Patent No.: US 10,614,753 B2
(45) Date of Patent: Apr. 7, 2020

(54) DISPLAY PANEL AND ELECTRONIC DEVICE

(71) Applicant: Shanghai Tianma AM-OLED Co., Ltd., Shanghai (CN)

(72) Inventors: Wanwan Xia, Shanghai (CN); Xian Chen, Shanghai (CN); Lijing Han, Shanghai (CN); Yu Xin, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 73 days.

(21) Appl. No.: 15/974,340

(22) Filed: May 8, 2018

(65) Prior Publication Data

US 2019/0206313 A1    Jul. 4, 2019

(30) Foreign Application Priority Data

Jan. 2, 2018 (CN) .......................... 2018 1 0001950

(51) Int. Cl.
  *G09G 3/3225* (2016.01)
  *G09G 3/20* (2006.01)
  *H01L 27/32* (2006.01)

(52) U.S. Cl.
  CPC ....... *G09G 3/3225* (2013.01); *H01L 27/3218* (2013.01); *G09G 3/2003* (2013.01);
  (Continued)

(58) Field of Classification Search
  CPC ............. G09G 3/30; G09G 2300/0452; G09G 2340/0457; G09G 2320/062;
  (Continued)

(56) References Cited

U.S. PATENT DOCUMENTS 3,971,065 A *  7/1976  Bayer ............... H01L 27/14621
                                                348/276
2003/0085906 A1* 5/2003  Elliott ...................... G09G 3/20
                                                345/613
(Continued)

FOREIGN PATENT DOCUMENTS

CN       1221940 A    7/1999
CN     101176108 A    5/2008
CN     103681754 A    3/2014

OTHER PUBLICATIONS

CN First Office Action, Application No. 201810001950.4, dated Jan. 7, 2020.

*Primary Examiner* — David Tung
(74) *Attorney, Agent, or Firm* — Alston & Bird LLP (57) ABSTRACT

The present disclosure provides a display panel and an electronic device including the display panel. The display panel includes a plurality of sub-pixels and a plurality of pixel units. The plurality of sub-pixels includes at least a first color sub-pixel and at least a second color sub-pixel. The plurality of sub-pixels and the plurality of pixel units are arranged in a one-to-one correspondence manner. The display panel provided by the present disclosure can greatly reduce the difficulty of the preparation process while remaining a high aperture ratio, thereby improving the production yield of the display panel, significantly reducing the preparation cost of the display panel, greatly improving the display performance of the display panel, providing a comfortable user experience.

18 Claims, 9 Drawing Sheets

(52) U.S. Cl.
CPC ............... *G09G 2300/0452* (2013.01); *G09G 2300/0465* (2013.01); *G09G 2320/0626* (2013.01); *G09G 2340/0457* (2013.01); *G09G 2380/02* (2013.01)

(58) Field of Classification Search
CPC .......... G09G 3/3225–3258; G09G 2300/0465; G09G 2320/0626; G09G 2380/02; G09G 3/2003; G09G 2300/0457; H01L 27/3218
See application file for complete search history.

(56) References Cited

U.S. PATENT DOCUMENTS

| | | | | |
|---|---|---|---|---|
| 2003/0218618 | A1* | 11/2003 | Phan | G09G 3/2074 345/629 |
| 2006/0028495 | A1* | 2/2006 | Phan | G09G 3/2003 345/694 |
| 2006/0132660 | A1* | 6/2006 | Kurumisawa | G09G 3/2003 348/631 |
| 2006/0284872 | A1* | 12/2006 | Brown Elliott | G09G 5/028 345/426 |
| 2009/0058873 | A1* | 3/2009 | Brown Elliott | G06T 5/009 345/589 |
| 2014/0022290 | A1* | 1/2014 | Saigo | G09G 3/002 345/694 |
| 2015/0035847 | A1* | 2/2015 | Park | G09G 3/2003 345/589 |

* cited by examiner

DISPLAY PANEL AND ELECTRONIC DEVICE

CROSS-REFERENCE TO RELATED APPLICATIONS

The present application claims priority to Chinese Patent Application No. CN 201810001950.4, filed on Jan. 2, 2018, the content of which is incorporated herein by reference in its entirety.

TECHNICAL FIELD

The present disclosure relates to the field of display technologies and, in particular, to a display panel and an electronic device including the display panel.

BACKGROUND

With the development of optical technology and semiconductor technology, since flat panel display technologies such as Liquid Crystal Display (LCD) and Organic Light-Emitting Diode (OLED) have characteristics of thinner body, lower cost, lower energy consumption, faster response, better color purity and brightness, higher contrast ration and so on, the flat panel display technologies have been widely used in various types of electronic products.

In the related art, a length-width ratio of each sub-pixel of a real RGB display panel is approximately 3:1. Adjacent red sub-pixel, green sub-pixel and blue sub-pixel in a same row form a pixel unit so as to display various colors.

For improving the visual effect, people place a higher and higher demand on a resolution of the display panel, which requires that the number of sub-pixels in a same area is constantly increased, i.e., the size of a sub-pixel becomes smaller and smaller. However, due to process limitations, the size of the sub-pixel cannot be infinitely decreased. How to improve an aperture ratio of the display panel and reduce the difficulty of preparation process of the display panel are common problems existing in the industry.

SUMMARY

The present disclosure provides a display panel and an electronic device including the display panel.

The present disclosure provides a display panel including a plurality of sub-pixels and a plurality of pixel units, each pixel unit is a minimum repetitive unit of the display panel for achieving a display function, and each sub-pixel is a minimum unit of the display panel capable of emitting a single color light; the plurality of sub-pixels includes at least a first color sub-pixel, at least a second color sub-pixel, and at least a third color sub-pixel; the plurality of sub-pixels is arranged in such a that a sub-pixel grid is used as a repetitive unit which is repetitively arranged respectively in a first direction and in a second direction, wherein the first direction X intersects with the second direction Y; the sub-pixel grid is a 2×2 sub-pixel matrix, and the 2×2 sub-pixel matrix includes a first sub-pixel, a second sub-pixel, a third sub-pixel and a fourth sub-pixel sequentially arranged in a clockwise direction; the first sub-pixel and the third sub-pixel each are the first color sub-pixel, the second sub-pixel is the second color sub-pixel, and the fourth sub-pixel is the third color sub-pixel; each of the plurality of sub-pixels corresponds to a respective one of the plurality of pixel units, and each of the plurality of pixel units corresponds to a respective one of the plurality of sub-pixels units.

The present disclosure further provides a display device including the above-mentioned display panel.

DESCRIPTION OF EMBODIMENTS

In order to understand the purposes, features and advantages of the present disclosure better, the present disclosure will be further described with reference to the accompanying drawings and embodiments.

It should be noted that, specific details are described in the following so as to make the present disclosure fully understandable. However, the present disclosure can be implemented in various other manners different from those described herein, and those skilled in the art can make similar promotions without departing from the scope of the present disclosure. Therefore, the present disclosure is not limited to the specific embodiments disclosed in the following. In addition, in the following description, a same reference sign in the drawings represents a same or similar structure, and thus a repetitive description thereof will be omitted.

Meanwhile, the drawings and the description of the embodiments are intended to be illustrative and not restrictive. A same reference number throughout the specification represents a same element. In addition, thicknesses of some layers, films, panels, areas and the like may be exaggerated in the figures for ease of understanding and description. It will also be understood that, when an element such as a layer, film, area or substrate is referred to as being "on" another element, it is possible that it is directly on the other element or it is also possible that an intermediate element exists. In addition, "on" means positioning an element on or under another element, but does not mean positioning on an upper side of another element according to gravity direction. For ease of understanding, elements in the drawings of the present disclosure are drawn on an upper side of another element.

Further, variations of the word "comprise" and such as "include" or "have" will be understood as including this element, but not excluding any other element, unless expressly stated to the contrary.

It should also be noted that, "and/or" mentioned in the embodiments of the present disclosure means "including any and all combinations of one or more related listed items. In the embodiments of the present disclosure, the terms "first", "second" and the like are intended to describe various components, but not intended to limit these components. These terms are only used to distinguish one element from another element, and, unless the context clearly indicates otherwise, the singular expressions "a", "an" and "this (the)" are intended to include the plural cases as well.

Figure 1:
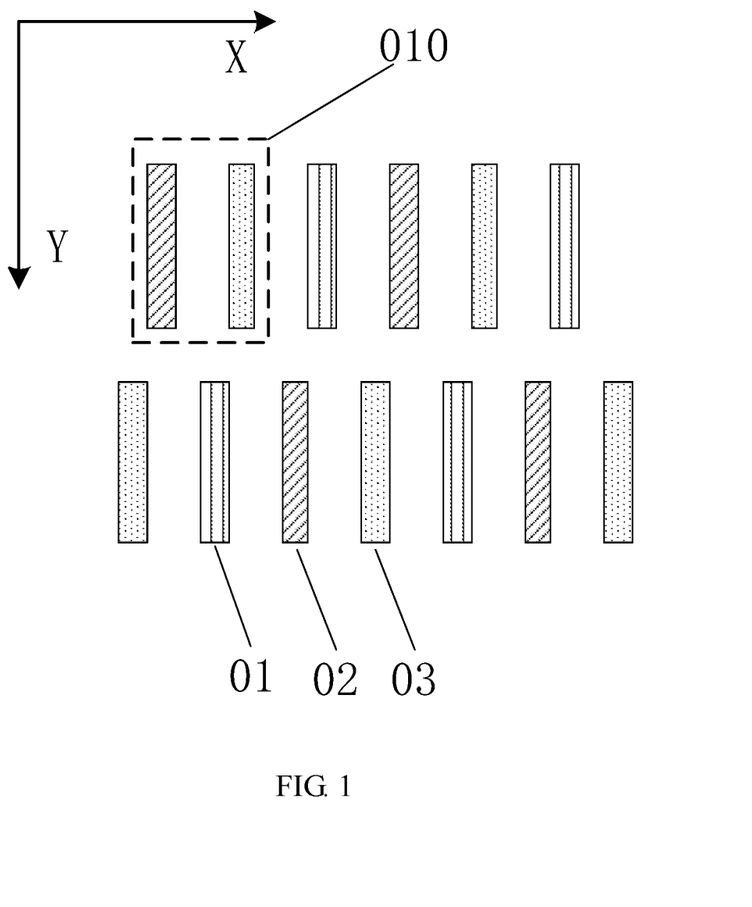
FIG. 1 is a schematic diagram illustrating a pixel rendering manner in the related art.
Figure 2:
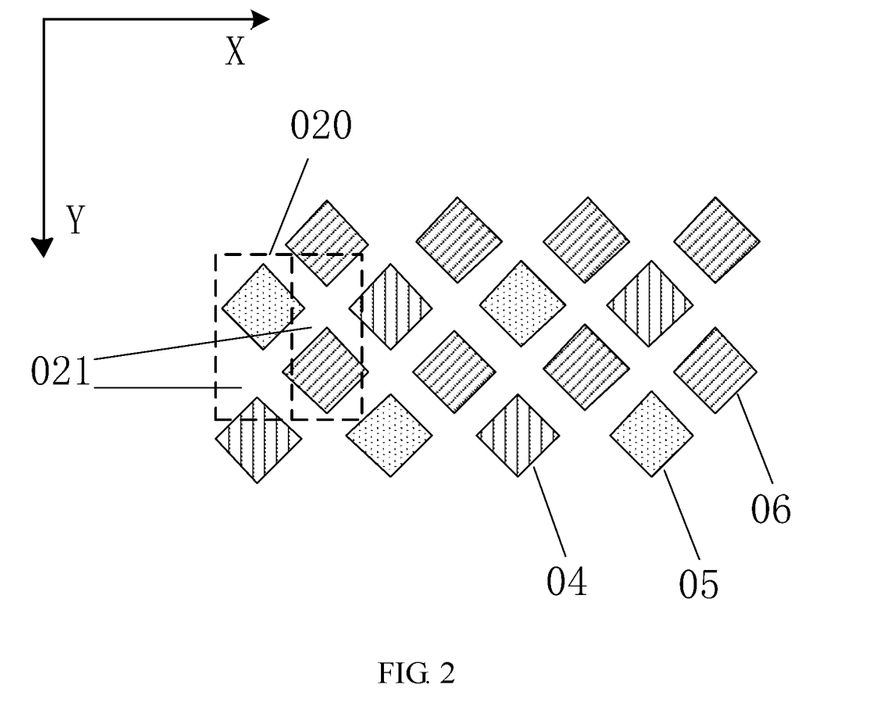
FIG. 2 is a schematic diagram illustrating another pixel rendering manner in the related art.

First, with reference to FIG. 1 and FIG. 2, FIG. 1 and FIG. 2 are schematic diagrams of some pixel rendering manners commonly used in the related art. As described above, the length-width ratio of each sub-pixel of the real RGB display panel in the related art is approximately 3:1. Adjacent red sub-pixel, green sub-pixel and blue sub-pixel in a same row together form one pixel unit for displaying various colors. However, as the resolution of the display panel increases, the size of the sub-pixel becomes smaller and smaller, and thus a higher demand is placed on the display panel manufacturing process. As a result, pixel rendering technologies appear so that the display panel can achieve a same resolution with a smaller number of sub-pixels by rendering the brightness of the surrounding sub-pixels, and thus the size of a single sub-pixel is unnecessary to be excessively small, in such a manner, the process difficulty of the display panel can be reduced to some extent.

With the pixel arrangement shown in FIG. 1, in a plane formed by a first direction X and a second direction Y, a display panel includes three types of sub-pixels 01, 02, and 03 arranged in an array. With the pixel rendering technology, the pixel unit 010 includes two sub-pixels 02 and 03 adjacent to each other, and by rendering the brightness of the sub-pixel 01 adjacent thereto, the pixel unit 010 is capable of displaying various colors. In addition, as shown in FIG. 2, in the plane formed by the first direction X and the second direction Y, the display panel includes three types of sub-pixels 04, 05, and 06 arranged in an array. With the pixel rendering technology, the display panel may be equivalent to including a pixel unit 020 arranged in an array, wherein the pixel unit 020 is equivalent to including two sub-pixels 021 adjacent to each other, so that the pixel unit 020 is capable of displaying various colors. The two common pixel rendering manners described above can in some extent avoid a situation that the size of a single sub-pixel is excessively small, which is beneficial to the manufacturing process of the display panel. However, for a display panel with ultra-high resolution, such a pixel arrangement cannot meet the requirements due to its own limitations, even if the pixel rendering technology is used.

For example, as for the pixel rendering manner shown in FIG. 2, in a high-resolution OLED display device, the size of each pixel may be as small as 32 μm, in order to realize an ultra-high resolution of 5.5 inches and 4k2k. Considering the inside and outside shadow effect of the OLED evaporation mask and limitation of the mask bridge of a same color, a total aperture ratio of the RGB colors of a final design is less than 3% (R:G:B=1:1:1). It is not possible for such an aperture ratio to realize normal displaying. If the aperture ratio remains no loss, a great risk of color mixing is inevitably taken, reducing the display quality, while the manufacturing difficulty of the evaporation mask is increased.

On the basis of the above-mentioned problems existing in the related art, the present disclosure provides a display panel and an electronic device including the display panel. The display panel includes a plurality of sub-pixels and a plurality of pixel units. The plurality of sub-pixels includes at least a first color sub-pixel and at least a second color sub-pixel. The plurality of sub-pixels and the plurality of pixel units are arranged in a one-to-one correspondence manner. With the pixel rendering technology, the sub-pixel of the display panel of the present disclosure can render the brightness of another sub-pixel adjacent to the sub-pixel, so as to form a brightness center and thus being used as one pixel unit, so that the plurality of sub-pixels and the plurality of pixel units can be arranged in a one-to-one correspondence manner, as a result, the display panel can greatly reduce the difficulty of the preparation process while remaining a high aperture ratio, thereby improving the manufacturing yield of the display panel, significantly reducing the manufacturing cost of the display panel, greatly improving the display performance of the display panel, and providing a comfortable user experience.

Figure 3:
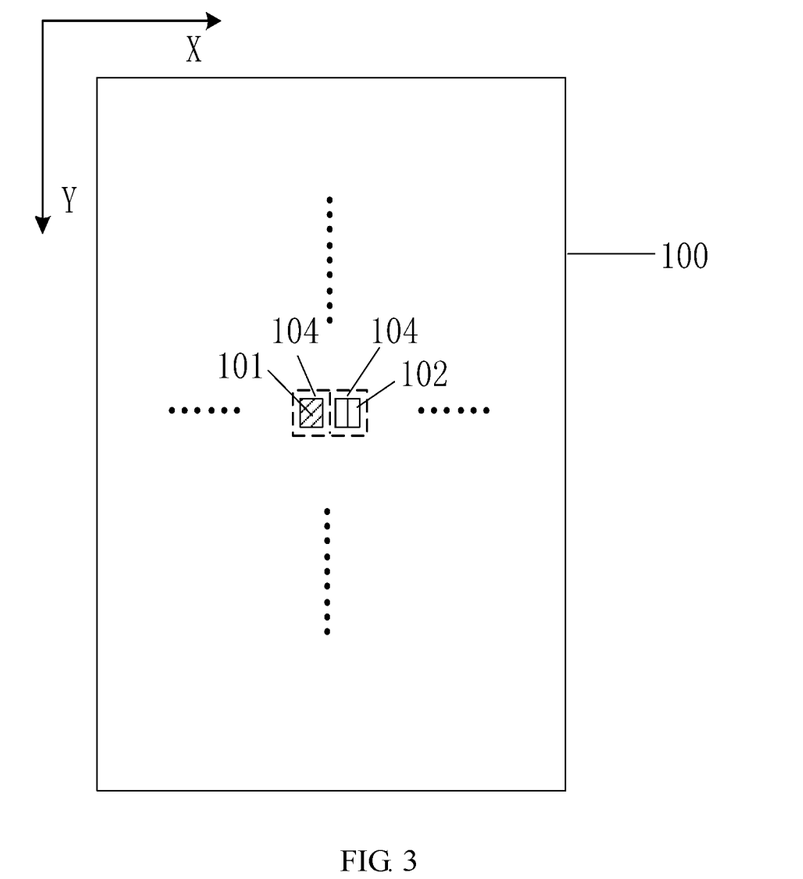
FIG. 3 is a structural schematic diagram of a display panel according to an embodiment of the present disclosure.

In the following description, various possible implementation manners of the present disclosure will be described by taking an example that the technical solution of the present disclosure is applied in an OLED panel. First, with reference to FIG. 3, FIG. 3 is a structural schematic diagram of a display panel according to an embodiment of the present disclosure. As shown in FIG. 3, a display panel 100 includes: a plurality of sub-pixels and a plurality of pixel units 104. The plurality of sub-pixels includes at least a first color sub-pixel 101 and at least a second color sub-pixel 102, wherein the plurality of sub-pixels and the plurality of pixel units 104 are arranged in a one-to-one correspondence manner. It should be noted that, the pixel unit described in the present disclosure refers to the minimum repetitive unit of the display panel for realizing a display function, and each pixel unit can emit light with a wavelength within a specific wavelength band required for the display panel to realize the display function, a plurality of pixel units is repeatedly arranged to form pixel points of the display panel, so that the display panel can perform normal display. The sub-pixel described in the present disclosure refers to a minimum unit in a display panel capable of emitting light having a single color, and the display panel may have a plurality of sub-pixels capable of emitting light having different colors. For example, as for an organic light-emitting display panel, each sub-pixel may include a pixel drive circuit and a light-emitting device, wherein the light-emitting device may further include a first electrode, a light-emitting function layer, and a second electrode which are stacked.

In the related art, for a real RGB-typed display panel, adjacent red sub-pixel, green sub-pixel and blue sub-pixel in a same row together form one pixel unit for displaying, that is, one pixel unit of the real RGB-typed display panel corresponds to three sub-pixels having different colors. However, in the related art, as the display panel shown in FIG. 1 and FIG. 2, the pixel unit 010 includes adjacent two sub-pixels 02 and 03, and the pixel unit 020 includes adjacent two sub-pixels 021, i.e., one pixel unit corresponds to two sub-pixels having different colors. It can be seen that, no matter what type of display panel in the related art, for achieving a normal display function, each pixel unit corresponds to at least two types of sub-pixels. As the resolution is increased, for each sub-pixel, the reduction in pixel size still faces inevitable challenge.

In the above-mentioned embodiments of the present disclosure, the inventor of the present disclosure deeply analyzes the limitations of the related art and creatively purposes that, in a display panel including pixels having different colors, a plurality of sub-pixels and a plurality of pixel units are arranged in a one-to-one correspondence manner, i.e., each pixel unit corresponds to a respective one sub-pixel, and each sub-pixel corresponds to a respective one pixel unit. As a result, the display panel successfully breaks through the limitation in the related art that each pixel unit corresponds to at least two sub-pixels, and the physical size of the display unit is minimized as much as possible. Thus, in high-resolution display panel applications, it is possible to greatly reduce the difficulty of the preparation process while remaining a high aperture ratio, thereby improving the manufacturing yield of the display panel, significantly reducing the manufacturing cost of the display panel, and greatly improving the display performance of the display panel, providing a comfortable user experience.

It should be noted that, in an embodiment of the present disclosure, the display panel 100 may only include two sub-pixels emitting light with different colors, i.e., a first color sub-pixel 101 and a second color sub-pixel 102, so as to be applied to a specific display scene. That is, the display panel of the present disclosure may be a display panel including sub-pixels having non-three or more than three different colors for achieving full-color display. For example, the display panel only includes red sub-pixels and green sub-pixels and does not include blue sub-pixels, so that the display panel is suitable for a specific display scene, and a full-color display is not necessary. It depends on actual circumstances.

Figure 4:
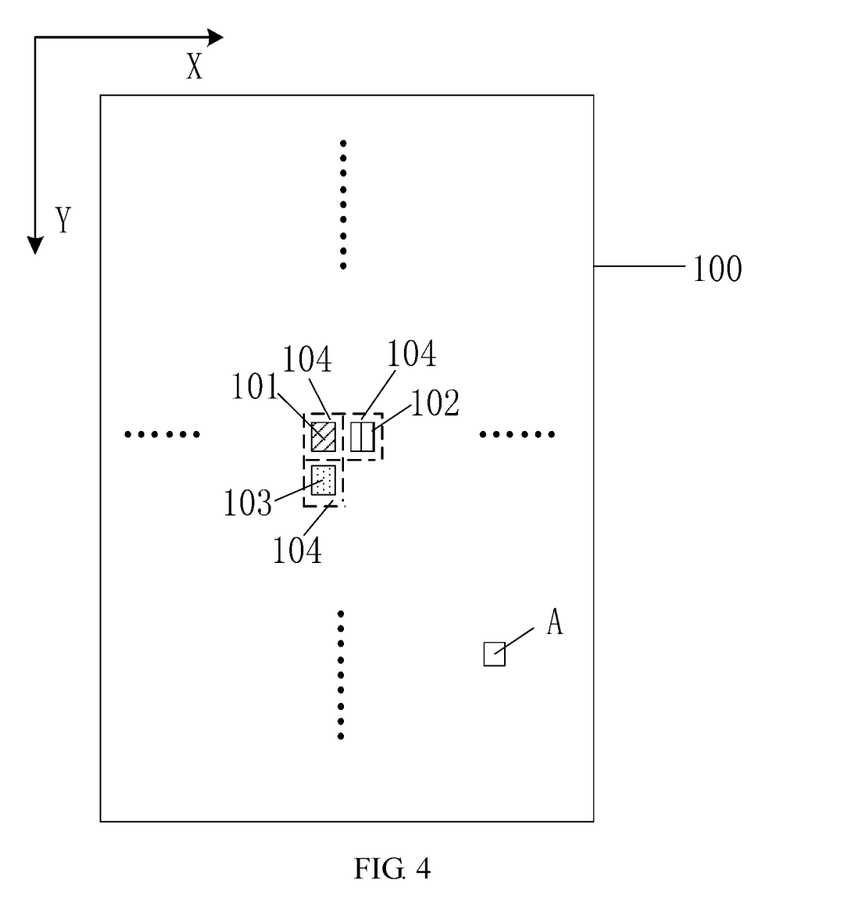
FIG. 4 is a structural schematic diagram of another display panel according to an embodiment of the present disclosure.

The display panel 100 may also be as shown in FIG. 4, wherein the plurality of sub-pixels further includes at least a third color sub-pixel 103, wherein the plurality of pixel units and the plurality of pixel units 104 are arranged in a one-to-one correspondence manner. That is, the display panel 100 may include three sub-pixels emitting light with different colors.

Figure 5:
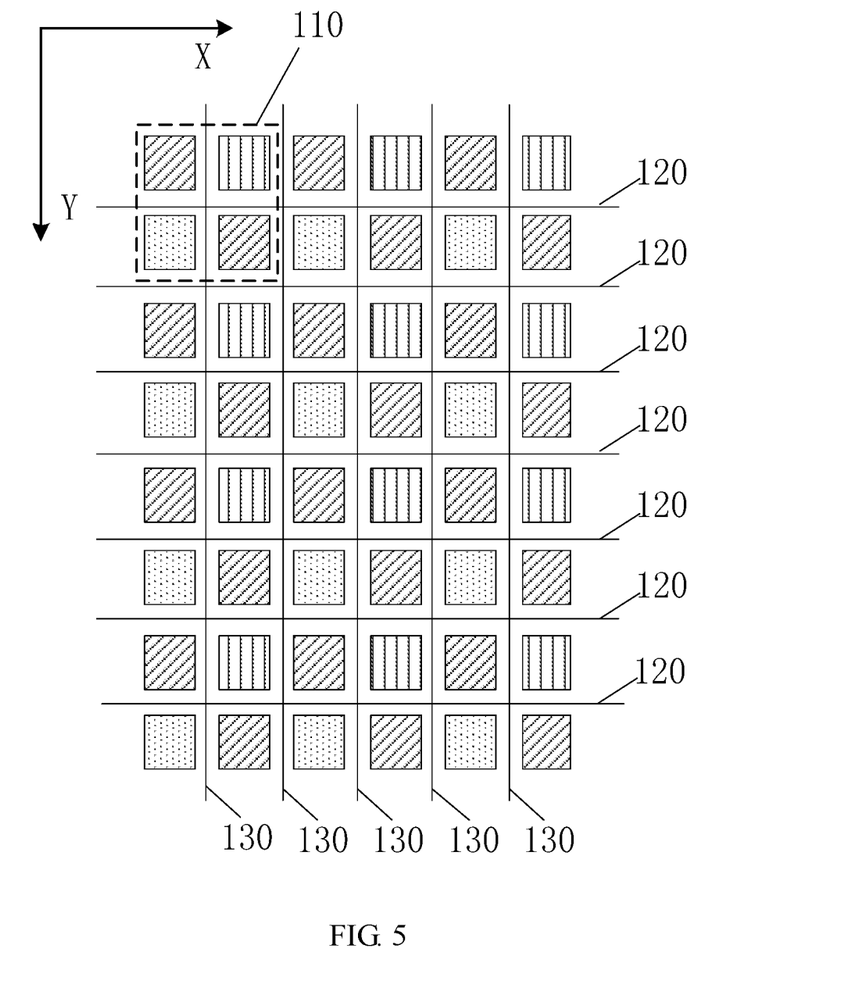
FIG. 5 is an enlarged view of area A in FIG. 4.

With reference to FIG. 5, FIG. 5 is an enlarged view of area A in FIG. 4, and shows a pixel arrangement manner according to an embodiment of the present disclosure. As can be seen from FIG. 5, the plurality of sub-pixels of the display panel is arranged in a manner as follows: using a sub-pixel grid 110 as a repetitive unit, and a repetitive arrangement is provided respectively in a first direction X and in a second direction Y, wherein the first direction X intersects with the second direction Y Further, with reference to FIG. 6 to FIG. 8, the sub-pixel grid 110 is a 2×2 sub-pixel matrix, and the 2×2 sub-pixel matrix includes a first sub-pixel 111, a second sub-pixel 112, a third sub-pixel 113, and a fourth sub-pixel 114 which are arranged in an anticlockwise direction. The first sub-pixel 111 and the third sub-pixel 113 emit light with a same color, and are a first color sub-pixel of the display panel. The second sub-pixel 112 is a second color sub-pixel, and the fourth sub-pixel 114 is a third color sub-pixel.

Further, as shown in FIG. 5, the display panel further includes a plurality of scan lines 120 extending along the first direction X and a plurality of data lines 130 extending along the second direction Y. The plurality of data lines 130 intersects with the plurality of scan lines 120 so as to define the plurality of sub-pixels described in the above-mentioned embodiments of the present disclosure. In other embodiments, it is also possible that the data line extends along the first direction X, and the scan line extends along the second direction Y; or it is also possible that the extending direction of the scan line deviates from the first direction by an angle, and the extending direction of the data line deviates from the second direction by an angle. The present disclosure is not intended to limit herein.

Here, it should also be noted that, the first direction X and the second direction Y in the present disclosure may be located in a plane where the display panel is located. When the display panel is a flexible display panel, the first direction X and the second direction Y may be located in a plane where the flexible display panel is located when the flexible display panel is unfolded to be flat. In some embodiments, the first direction X is perpendicular to the second direction Y. In some other embodiments, the first direction X is not perpendicular to the second direction Y, and an included angle between the first direction X and the second direction Y may be either an acute angle or an obtuse angle, which is not limited in the present disclosure.

Figure 6:
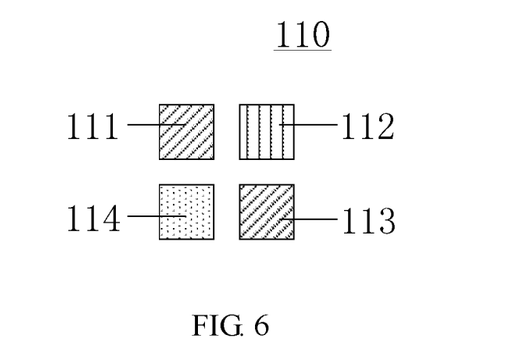
FIGS. 6-8 are schematic diagrams of some implementation manners of sub-pixel grid provided by embodiments of the present disclosure.

Optionally, as shown in FIG. 6, in the above-mentioned embodiments of the present disclosure, the first color sub-pixel is a green sub-pixel, the second color sub-pixel is a red sub-pixel, and the third color sub-pixel is a blue sub-pixel; or the first color sub-pixel is a green sub-pixel, the second color sub-pixel is a blue sub-pixel, and the third color sub-pixel is a red sub-pixel. That is, the sub-pixel 111 and the sub-pixel 113 emit light with a same color, and both are green sub-pixels; the sub-pixels 112 and 114 are a red sub-pixel and a blue sub-pixel, respectively. Through deeper research, the inventor has found that, by adopting such a sub-pixel grid arrangement manner, from the vision perspective, the human eye can have a better visual feeling and a comfortable visual experience.

Figure 7:
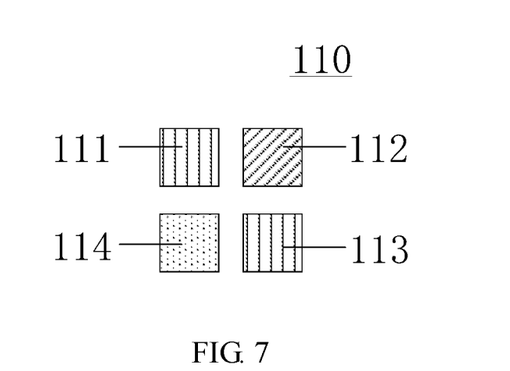
Figure 8:
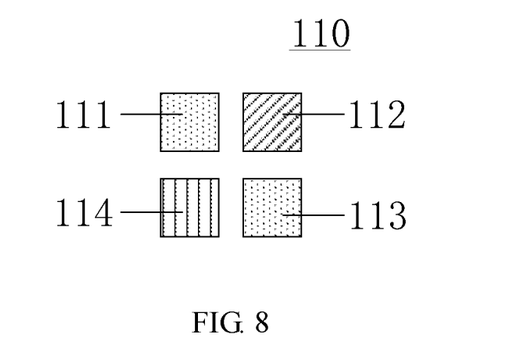

In some other embodiments, the sub-pixel grid arrangement of the present disclosure may also be as shown in FIG. 7, wherein the sub-pixel 111 and the sub-pixel 113 have a same light-emitting color, and both are red sub-pixels; the sub-pixel 112 and the sub-pixel 114 are a green sub-pixel and a blue sub-pixel, respectively. Or, as shown in FIG. 8, the sub-pixel 111 and the sub-pixel 113 have a same light-emitting color, and both are blue sub-pixels, and the sub-pixel 112 and the sub-pixel 114 are a green sub-pixel and a red sub-pixel, respectively. Next, the pixel rendering manner in embodiments of the present disclosure will be described by taking the sub-pixel grid arrangement as shown in FIG. 6 as an example.

In order to achieve that the plurality of sub-pixels and the plurality of pixel units can be arranged in a one-to-one correspondence manner, the inventor earnestly pondered and conducted further studies to propose the following pixel rendering manner: the brightness of the pixel unit corresponding to the first sub-pixel 111 is obtained by the first sub-pixel 111 rendering the brightness of each sub-pixel which is adjacent to the first sub-pixel 111 and different from the first sub-pixel 111 in light-emitting color; the brightness conversion algorithm of the pixel unit corresponding to the third sub-pixel 113 is the same as the brightness conversion algorithm of the pixel unit corresponding to the first sub-pixel 111. With the above-described pixel arrangement and pixel rendering technology, a sub-pixel of the display panel in the embodiments of the present disclosure may render the brightness of another sub-pixel adjacent to said sub-pixel to form a brightness center so as to be used as one pixel unit, so that the plurality of sub-pixels and the plurality of pixel units can be arranged in a one-to-one correspondence manner, thus, the display panel can greatly reduce the difficulty of the preparation process while remaining a high aperture ratio, thereby improving the production yield of the display panel, significantly reducing the preparation cost of the display panel, greatly improving the display performance of the display panel, providing a comfortable user experience.

Optionally, the brightness of the pixel unit corresponding to the second sub-pixel 112 is obtained by the second sub-pixel 112 rendering the brightness of each sub-pixel adjacent to the second sub-pixel 112; the brightness conversion algorithm of the pixel unit corresponding to the fourth sub-pixel 114 is the same as the brightness conversion algorithm of the pixel unit corresponding to the second sub-pixel 112. With the above-described pixel arrangement and pixel rendering technology in the embodiments of the present disclosure, each sub-pixel corresponds to a respective one pixel unit. Thus, if a display with a resolution of A (horizontal)*B(Vertical) is intended to be presented, a total number of the sub-pixels is also A(horizontal)*B(Vertical). In addition, for an OLED display panel, considering the inside and outside shadows of the evaporation mask and limitation of the mask bridge of a same color, a total aperture ratio of the RGB colors of the final design can reach 15% (R:G:B=1:1:1). Compared with the related art, the aperture ratio is increased greatly, the risk of color mixing is reduced and the difficulty of manufacturing an evaporation mask (EL mask) is also decreased.

Figure 9:
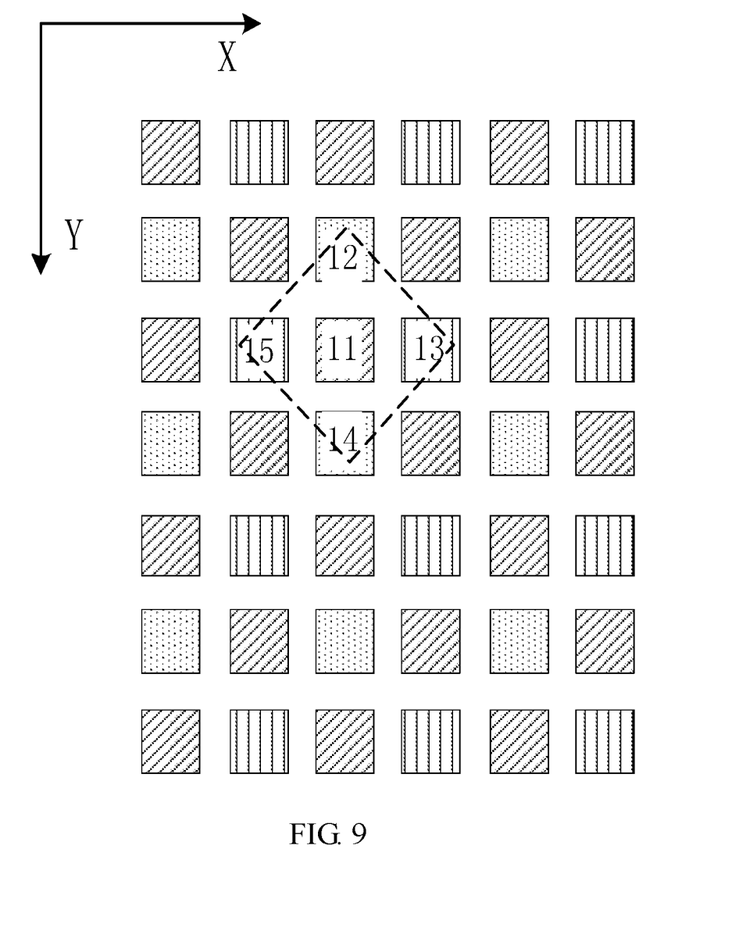
FIG. 9 is a schematic diagram of a brightness rendering manner of a pixel unit corresponding to a first sub-pixel according to an embodiment of the present disclosure.
Figure 10:
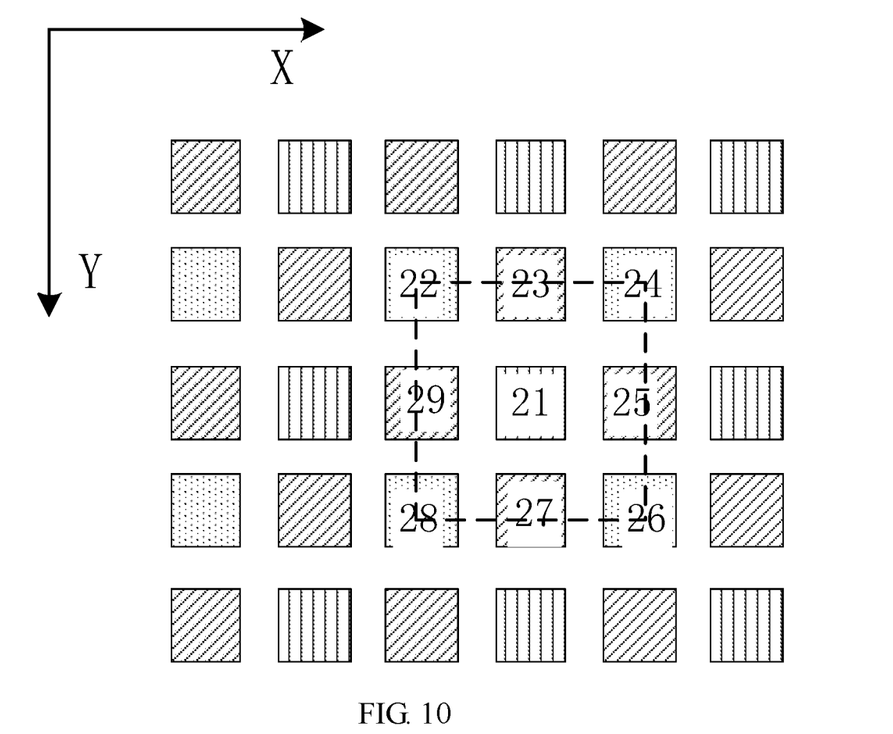
FIG. 10 is a schematic diagram of a brightness rendering manner of a pixel unit corresponding to a second sub-pixel according to an embodiment of the present disclosure.

On the basis of the above description, another embodiment of the present disclosure further provides a brightness conversion algorithm, which will be further described in the following with reference to FIG. 9 and FIG. 10. FIG. 9 is a schematic diagram of a brightness rendering manner of a pixel unit corresponding to a first sub-pixel according to an embodiment of the present disclosure. FIG. 10 is a schematic diagram of a brightness rendering manner of a pixel unit corresponding to a second sub-pixel according to an embodiment of the present disclosure.

As shown in FIG. 9, the brightness of the pixel unit corresponding to the first sub-pixel 11 (111) is obtained by a first sub-pixel 11 (111) rendering the brightness of the sub-pixel 12, the sub-pixel 13, the sub-pixel 14 and the sub-pixel 15 around the first sub-pixel 11 (111), wherein the sub-pixel 12, the sub-pixel 13, the sub-pixel 14, and the sub-pixel 15 are respectively adjacent to the first sub-pixel 11 (111) and have different light-emitting colors from the first sub-pixel. The brightness $L_1$ of the pixel unit corresponding to the first sub-pixel is obtained according to the following brightness conversion algorithm: $L_1 = m(L_{11} + L_{12}/8 + L_{13}/8 + L_{14}/8 + L_{15}/8)$.

$L_{11}$ is the brightness of the first sub-pixel; $L_{12}$, $L_{13}$, $L_{14}$, and $L_{15}$ each are the brightness of a sub-pixel adjacent to the first sub-pixel and different from the first sub-pixel in light-emitting color, m is a first brightness adjustment coefficient, and $0 < m \leq 1$.

With the above-described pixel arrangement and pixel brightness conversion algorithm, a sub-pixel of the display panel in the embodiments of the present disclosure may render the brightness of another sub-pixel adjacent to the previous sub-pixel to form a brightness center so as to be used as one pixel unit, so that the plurality of sub-pixels and the plurality of pixel units can be arranged in a one-to-one correspondence manner, thus, the display panel can greatly reduce the difficulty of the preparation process while remaining a high aperture ratio, thereby improving the production yield of the display panel, significantly reducing the preparation cost of the display panel, greatly improving the display performance of the display panel, and providing a comfortable user experience.

Optionally, as shown in FIG. 10, the brightness of the pixel unit corresponding to a second sub-pixel 21 (112) is obtained by the second sub-pixel 21 (112) rendering the brightness of the sub-pixel 22, the sub-pixel 23, the sub-pixel 24, the sub-pixel 25, the sub-pixel 26, the sub-pixel 27, the sub-pixel 28, and the sub-pixel 29 around the second sub-pixel 21 (112). The sub-pixel 22, the sub-pixel 23, the sub-pixel 24, the sub-pixel 25, the sub-pixel 26, the sub-pixel 27, the sub-pixel 28 and the sub-pixel 29 are respectively adjacent to the second sub-pixel 11 (111) and have different light-emitting colors from the second sub-pixel 21. The brightness $L_2$ of the pixel unit corresponding to the second sub-pixel is obtained according to the following brightness conversion algorithm: $L_2 = n(L_{21} + L_{22}/8 + L_{23}/4 + L_{24}/8 + L_{25}/4 + L_{26}/8 + L_{27}/4 + L_{28}/8 + L_{29}/4)$.

$L_{21}$ is the brightness of the second sub-pixel; $L_{22}$, $L_{23}$, $L_{24}$, $L_{25}$, $L_{26}$, $L_{27}$, $L_{28}$, and $L_{29}$ each are the brightness of a sub-pixel adjacent to the second sub-pixel and different from the second sub-pixel in light-emitting color, n is a second brightness adjustment coefficient, and $0 < n \leq 1$.

Through further studies, the inventor found that, in some embodiments, in a case that a relationship between the first brightness adjustment coefficient m and the second brightness adjustment coefficient n satisfies $m = n/2$, when the display panel on the basis of the pixel arrangement manner according to the above-described embodiments of the present disclosure performs pixel rendering, the brightness conversion algorithm is relatively simpler, the operation load of the IC chip is relatively lower, and the color uniformity of the resulting picture is relatively better, which can avoid the phenomenon of color mixing and color cast to a large extent. In addition, the inventor also found that, in the case that $m = n/2$, the human eye has a better visual feeling, and the visual sense experience is more comfortable. Further, optionally, $m = \frac{1}{2}$ and $n = 1$, which make it easier to obtain a more simple operational method, thereby further reducing the operation load and obtaining a better visual experience.

In some embodiments, the brightness conversion algorithm of the pixel unit corresponding to the third sub-pixel is the same as the brightness conversion algorithm of the pixel unit corresponding to the first sub-pixel; and the brightness conversion algorithm of the pixel unit corresponding to the fourth sub-pixel is the same as the brightness conversion algorithm of the pixel unit corresponding to the second sub-pixel. The OLED display panel adopting the pixel brightness conversion method according to the embodiments of the present disclosure has smaller preparation process difficulty and excellent display performance. Meanwhile, a total aperture ratio of the final design of the panel can be increased to 15%, which greatly improves the aperture ratio, and reduces the risk of color mixing.

It should also be noted that, for the display panel described in the above-mentioned embodiments of the present disclosure, each sub-pixel may have a shape that is approximately a square. For example, as shown in FIG. 5, each sub-pixel may have a shape that is approximately a square. The "approximately a square" herein means that, it may be a square, or it may has a certain deviation from a real square pattern due to process or design reason but still is approximate to a square shape, for example, a side length of the sub-pixel may exist a deviation within a certain range, or a vertex angle of the sub-pixel has a certain deviation from a right angle, or the vertex angle of the sub-pixel is formed as an approximately rounded shape. In addition, those skilled in the art should understand that, except an approximate square, each sub-pixel may also be formed as other shape, such as an approximate rectangle, an approximate rhombus, an approximate ellipse, and an approximate circle, an approximate regular hexagon, approximate trapezoid and other deformations, which will not be limited herein by the present disclosure.

Optionally, for the display panel described in the above-mentioned embodiments of the present disclosure, the plurality of sub-pixels each has an approximately same area. For example, as shown in FIG. 5, each sub-pixel may have an approximately same area. The "approximately same area" herein means that, each sub-pixel in the display panel may have a same area with a constant value, or it may be configured that, the area of each sub-pixel may be deviated by a certain amount or the areas of sub-pixels having different light-emitting colors may be deviated by a certain amount due to process or design reason but still can be approximately considered to be equal to each other. It should be noted that, in other embodiments of the present disclosure, it is not necessary that all of the sub-pixels of the display panel have an approximately same area, for example, the sub-pixels in some areas may have areas larger than those in other positions, or, the sub-pixels with a certain color may have areas larger than that of the sub-pixels with other colors, for example, for example, the green sub-pixel may have an area which is half of the area of the red sub-pixel or blue sub-pixel. The present disclosure is not limited herein, and it depends on the actual application situation.

Figure 11:
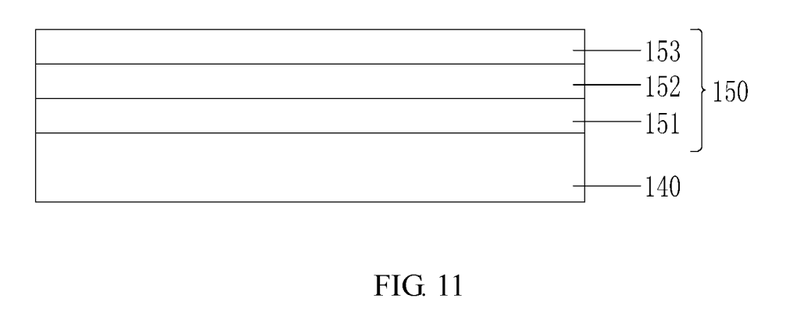
FIG. 11 is a structural schematic diagram of a sub-pixel provided by an embodiment of the present disclosure.

When the display panel is an OLED display panel, each of the plurality of sub-pixels includes a pixel drive circuit and a light-emitting device. The light-emitting device includes a first electrode, a light-emitting function layer and a second electrode arranged which are stacked. Specifically, it will be further described with reference to FIG. 11. As shown in FIG. 11, each of the plurality of sub-pixels of the display panel includes a pixel drive circuit 140 and a light-emitting device 150.

The light-emitting device 150 includes a first electrode 151, a light-emitting function layer 152, and a second electrode 153 which are stacked. The pixel drive circuit 140 may include one or more of various types of elements, such as a thin film transistor element (e.g. a drive transistor, a switch transistor, etc.,), a storage capacitor, etc. And it is electrically connected to the OLED light-emitting device 150 for driving the OLED light-emitting device 150 to perform normal light-emitting. Such an OLED panel is an active matrix OLED display panel. The thin film transistor may be any type of thin film transistor such as an amorphous silicon thin film transistor (a-Si TFT), or a low temperature poly-silicon (LTPS) TFT, an oxide TFT or an Organic Field-Effect Transistor (OFET), etc., or a hybrid TFT, which will not be limited herein. In addition, the drive manner of the flexible panel of the present disclosure may also be a type of a passive matrix or the like, which will not be limited herein.

In some embodiments, the first electrode 151 is used as an anode and may be formed by various conductive material. For example, the first electrode 151 may be formed as a transparent electrode or a reflective electrode according to its application. When the first electrode 151 is formed as a transparent electrode, the first electrode 151 may include indium tin oxide (ITO), indium zinc oxide (IZO), zinc oxide (ZnO), indium oxide ($In_2O_3$), etc. When the first electrode 151 is formed as a reflective electrode, the reflective layer may be made by Ag, Mg, Al, Pt, Pd, Au, Ni, Nd, Ir, Cr or a combination thereof, and the material ITO, IZO, ZnO or $In_2O_3$ may be formed on the reflective layer.

The light-emitting function layer 152 is located on the first electrode 151, and a portion of the first electrode 151 where the light-emitting function layer 152 is located is not covered by a pixel definition layer or is exposed. The light-emitting function layer 152 may be formed by a vapor deposition process, in the OLED panel, the light-emitting material layer is patterned to correspond to each sub-pixel, i.e., correspond to the first electrode film layer which is patterned.

The light-emitting function layer 152 may be formed by a low molecular weight organic material or a high molecular weight organic material. Besides an organic emission layer, the light-emitting function layer 152 may further include various other function layers. For example, the light-emitting function layer may further include one or more of a hole injection layer (HIL), a hole transport layer (HTL), an electron transport layer (ETL) and an electron injection layer (EIL).

The second electrode 153 (as a cathode of the light-emitting device 150) is located on the light-emitting function layer 152. Similar to the first electrode 151, the second electrode 153 may be formed as a transparent electrode or a reflective electrode. Optionally the first electrode includes silver. In addition, those skilled in the art should understand that, the second electrode 153 may also be used as the anode of the light-emitting device 150 besides being used as the cathode of the light-emitting device 150, correspondingly, the first electrode 151 can also be used as the cathode of the light-emitting device 150 besides being used as the anode of the light-emitting device 150.

It should be noted that, although the above-mentioned embodiments of the present disclosure are described by taking a OLED panel as an example, the display panel 100 provided by the embodiments of the present disclosure may also be a liquid crystal display panel, an electronic paper, a Quantum Dot Light Emitting Diodes (QLED) display panel, a micro light emitting diode LED (pLED) panel, or other types of display panels. The display panel may be a display panel of a bottom emission type panel, a top emission type panel, a double-sided display panel, a transparent display panel or the like, which will not be limited herein by the present disclosure.

Figure 12:
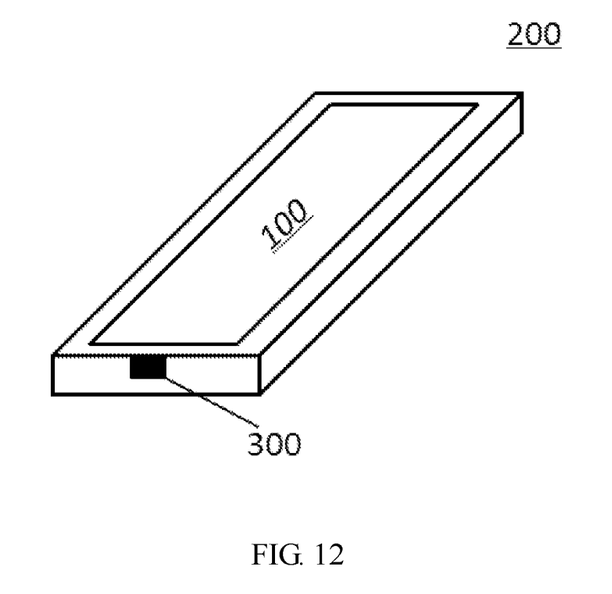
FIG. 12 is a schematic diagram of an electronic device according to an embodiment of the present disclosure.

In addition, as shown in FIG. 12, the present disclosure further provides an electronic device 200 including the above-described display panel 100. It should be noted that, the electronic device 200 may be any electronic product having a display function, including but not limited to the following categories: a television, a laptop, a desktop displayer, a tablet computer, a digital camera, a cellphone, a smart bracelet, a pair of intelligent glasses, a vehicle monitor, a medical equipment, an industrial control equipment, a touch interactive terminal, an electrophoresis display device, an electronic paper and so on. The electronic device 200 may be either a rigid display terminal or a flexible display device, which will not be limited herein.

Further, the electronic device 200 provided by the present disclosure may further include a drive chip 300 for controlling the display panel 100 for displaying, and the driving chip 300 is integrated with the above-mentioned brightness conversion algorithm. That is, the display device 200 of the present disclosure may be driven by a drive chip integrated with the brightness conversion algorithm, so as to implement pixel rendering of the display panel provided in the embodiments of the present disclosure, and thus achieving high-resolution display of the display panel while maintaining a high aperture ratio. In some other embodiments, the brightness conversion algorithm may also be integrated into other components of the electronic device 200, such as an array substrate, a data driver, a printed circuit board, etc., so as to implement the display function of the present disclosure, which will not limited herein.

The present disclosure provides a display panel and an electronic device including the display panel. The display panel includes a plurality of sub-pixels and a plurality of pixel units. The plurality of sub-pixels includes at least a first color sub-pixel and at least a second color sub-pixel. The plurality of sub-pixels and the plurality of pixel units are arranged in a one by one correspondence manner. With the pixel rendering technology, a sub-pixel of the display panel of the present disclosure can render the brightness of other sub-pixels adjacent to the previous sub-pixel to form a brightness center so as to be used as one pixel unit, so that the plurality of sub-pixels and the plurality of pixel units can be arranged in a one-to-one correspondence manner, thus, the difficulty of the preparation process of the display panel can be reduced while a high aperture ratio remains, the display performance is greatly improved, thereby providing a comfortable user experience. In addition, the production yield of the display panel is improved, and the preparation cost is reduced.

The above content is a further description of the present disclosure in combination with preferred embodiments, and it should not be considered to limit the implementation of the present disclosure. Those skilled in the art may make some deductions or replacements without departing from the concept of the present disclosure, all of which should be considered as being within the protection scope of the present disclosure.

What is claimed is:

1. A display panel, comprising a plurality of sub-pixels and a plurality of pixel units,
    wherein the plurality of pixel units each is a minimum repetitive unit of the display panel for achieving a display function, and wherein the plurality of sub-pixels each is a minimum unit of the display panel capable of emitting a single color light;
    wherein the plurality of sub-pixels comprises at least a first color sub-pixel, at least a second color sub-pixel, and at least a third color sub-pixel;
    wherein the plurality of sub-pixels is arranged in a sub-pixel grid repetitively arranged in both a first direction and a second direction, wherein the first direction intersects with the second direction;
    wherein the sub-pixel grid is a 2×2 sub-pixel matrix, comprising a first sub-pixel, a second sub-pixel, a third sub-pixel and a fourth sub-pixel sequentially arranged in a clockwise order;
    wherein the first sub-pixel and the third sub-pixel each are the first color sub-pixels, the second sub-pixel is the second color sub-pixel, and the fourth sub-pixel is the third color sub-pixel;
    wherein each of the plurality of sub-pixels corresponds to a respective one of the plurality of pixel units, and wherein each of the plurality of pixel units corresponds to a respective one of the plurality of sub-pixels;
    wherein a brightness $L_1$ of the pixel unit corresponding to the first sub-pixel is obtained according to the following brightness conversion algorithm:
    $L_1=m*(L_{11}+L_{12}/8+L_{13}/8+L_{14}/8+L_{15}/8)$, wherein $L_{11}$ is brightness of the first sub-pixel, $L_{12}$, $L_{13}$, $L_{14}$, and $L_{15}$ each is a brightness of a sub-pixel adjacent to the first sub-pixel and different from the first sub-pixel in light-emitting color, wherein m is a first brightness adjustment coefficient, and $0<m\leq 1$; and
    wherein a brightness $L_2$ of the pixel unit corresponding to the second sub-pixel is obtained according to the following brightness conversion algorithm:
    $L_2=n*(L_{21}+L_{22}/8+L_{23}/4+L_{24}/8+L_{25}/4+L_{26}/8+L_{27}/4+L_{28}/8+L_{29}/4)$, wherein $L_{21}$ is brightness of the second sub-pixel, $L_{22}$, $L_{23}$, $L_{24}$, $L_{25}$, $L_{26}$, $L_{27}$, $L_{28}$, and $L_{29}$ each is a brightness of a sub-pixel adjacent to the second sub-pixel and different from the second sub-pixel in light-emitting color, wherein n is a second brightness adjustment coefficient, and $0<n\leq 1$.

2. The display panel according to claim 1, wherein the first color sub-pixel is a green sub-pixel, the second color sub-pixel is a red sub-pixel, and the third color sub-pixel is a blue sub-pixel.

3. The display panel according to claim 1, wherein the first color sub-pixel is a green sub-pixel, the second color sub-pixel is a blue sub-pixel, and the third color sub-pixel is a red sub-pixel.

4. The display panel according to claim 1, wherein brightness of the pixel unit corresponding to the first sub-pixel is obtained by the first sub-pixel's rendering brightness of each sub-pixel adjacent to the first sub-pixel and different from the first sub-pixel in light-emitting color and
    wherein a brightness conversion algorithm of the pixel unit corresponding to the third sub-pixel is the same as said brightness conversion algorithm of the pixel unit corresponding to the first sub-pixel.

5. The display panel according to claim 4, wherein brightness of the pixel unit corresponding to the second sub-pixel is obtained by the second sub-pixel rendering brightness of each sub-pixel adjacent to said second sub-pixel; and
    wherein a brightness conversion algorithm of the pixel unit corresponding to the fourth sub-pixel is the same as a brightness conversion algorithm of said pixel unit corresponding to the second sub-pixel.

6. The display panel according to claim 1, wherein m=n/2.

7. The display panel according to claim 6, wherein n=1.

8. The display panel according to claim 1, wherein a brightness conversion algorithm of the pixel unit corresponding to the third sub-pixel is the same as the brightness conversion algorithm of the pixel unit corresponding to the first sub-pixel; and
    a brightness conversion algorithm of the pixel unit corresponding to the fourth sub-pixel is the same as the brightness conversion algorithm of the pixel unit corresponding to the second sub-pixel.

9. The display panel according to claim 1, wherein the first direction is perpendicular to the second direction.

10. The display panel according to claim 9, further comprising:
    a plurality of scan lines, extending along the first direction; and
    a plurality of data lines, extending along the second direction,
    wherein the plurality of data lines intersects with the plurality of scan lines to define the plurality of sub-pixels.

11. The display panel according to claim 1, wherein the plurality of sub-pixels each is substantially square-shaped.

12. The display panel according to claim 1, wherein the plurality of sub-pixels each has substantially a same area.

13. The display panel according to claim 1, wherein the display panel is an organic light-emitting display panel.

14. The display panel according to claim 13, wherein each of the plurality of sub-pixels comprises a pixel drive circuit and a light-emitting device,
    wherein the light-emitting device comprises a first electrode, a light-emitting function layer disposed on the first electrode, and a second electrode disposed on the light-emitting function layer.

15. An electronic device comprising a display panel, wherein the display panel comprises a plurality of sub-pixels and a plurality of pixel units, wherein the plurality of pixel units each is a minimum repetitive unit of the display panel for achieving a display function, and wherein the plurality of sub-pixels each is a minimum unit of the display panel capable of emitting a single color light;

wherein the plurality of sub-pixels comprises at least a first color sub-pixel, at least a second color sub-pixel, and at least a third color sub-pixel;

wherein the plurality of sub-pixels is arranged in a sub-pixel grid repetitively arranged in both a first direction and a second direction, wherein the first direction intersects with the second direction;

wherein the sub-pixel grid is a 2×2 sub-pixel matrix, comprising a first sub-pixel, a second sub-pixel, a third sub-pixel and a fourth sub-pixel sequentially arranged in a clockwise order;

wherein the first sub-pixel and the third sub-pixel each are the first color sub-pixels, the second sub-pixel is the second color sub-pixel, and the fourth sub-pixel is the third color sub-pixel;

wherein each of the plurality of sub-pixels corresponds to a respective one of the plurality of pixel units, and each of the plurality of pixel units corresponds to a respective one of the plurality of sub-pixels, wherein brightness $L_1$ of the pixel unit corresponding to the first sub-pixel is obtained according to the following brightness conversion algorithm:

$L_1 = m*(L_{11}+L_{12}/8+L_{13}/8+L_{14}/8+L_{15}/8)$, wherein $L_{11}$ is brightness of the first sub-pixel, $L_{12}$, $L_{13}$, $L_{14}$, and $L_{15}$ each is a brightness of a sub-pixel adjacent to the first sub-pixel and different from the first sub-pixel in light-emitting color, wherein m is a first brightness adjustment coefficient, and $0 < m \leq 1$; and wherein brightness $L_2$ of the pixel unit corresponding to the second sub-pixel is obtained according to the following brightness conversion algorithm:

$L_2 = n*(L_{21}+L_{22}/8+L_{23}/4+L_{24}/8+L_{25}/4+L_{26}/8+L_{27}/4+L_{28}/8+L_{29}/4)$, wherein $L_{21}$ is brightness of the second sub-pixel; $L_{22}$, $L_{23}$, $L_{24}$, $L_{25}$, $L_{26}$, $L_{27}$, $L_{28}$, and $L_{29}$ each is a brightness of a sub-pixel adjacent to the second sub-pixel and different from the second sub-pixel in light-emitting color, wherein n is a second brightness adjustment coefficient, and $0 < n \leq 1$.

16. The electronic device according to claim 15, further comprising a drive chip for controlling the display panel to perform displaying, wherein the drive chip is integrated with a brightness conversion algorithm.

17. The electronic device according to claim 15, wherein brightness of the pixel unit corresponding to the first sub-pixel is obtained by the first sub-pixel's rendering brightness of each sub-pixel adjacent to the first sub-pixel and different from the first sub-pixel in light-emitting color and wherein a brightness conversion algorithm of the pixel unit corresponding to the third sub-pixel is the same as said brightness conversion algorithm of the pixel unit corresponding to the first sub-pixel.

18. The electronic device according to claim 17, wherein brightness of the pixel unit corresponding to the second sub-pixel is obtained by the second sub-pixel rendering brightness of each sub-pixel adjacent to the second sub-pixel; and wherein a brightness conversion algorithm of the pixel unit corresponding to the fourth sub-pixel is the same as said brightness conversion algorithm of the pixel unit corresponding to the second sub-pixel.

* * * * *